United States Patent
Mobley et al.

(10) Patent No.: US 6,446,241 B1
(45) Date of Patent: Sep. 3, 2002

(54) AUTOMATED METHOD FOR TESTING CACHE

(75) Inventors: Christopher L. Mobley, Coppell; Timothy D. Anderson, Dallas; Charles L. Fuoco, Allen; Sanjive Agarwala, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 09/615,119

(22) Filed: Jul. 13, 2000

Related U.S. Application Data

(60) Provisional application No. 60/144,568, filed on Jul. 15, 1999.

(51) Int. Cl.[7] .................. G06F 17/50; G06F 12/00; G06F 12/14; G11C 29/00
(52) U.S. Cl. ..................... 716/4; 711/141; 714/718
(58) Field of Search ................. 716/4; 711/141; 714/718

(56) References Cited

U.S. PATENT DOCUMENTS

| | | | | |
|---|---|---|---|---|
| 5,038,307 A | | 8/1991 | Krishnakumar et al. .... | 364/578 |
| 5,045,996 A | * | 9/1991 | Barth et al. ................. | 711/143 |
| 5,163,016 A | | 11/1992 | Har'El et al. ............... | 364/578 |
| 5,394,347 A | | 2/1995 | Kita et al. .................. | 364/578 |
| 5,406,504 A | * | 4/1995 | Denisco et al. ............. | 702/117 |
| 5,513,122 A | | 4/1996 | Cheng et al. ............... | 364/489 |
| 5,813,028 A | * | 9/1998 | Agarwala et al. ........... | 711/118 |
| 5,875,462 A | * | 2/1999 | Bauman et al. ............. | 711/119 |
| 5,960,457 A | * | 9/1999 | Skrovan et al. ............. | 711/146 |
| 5,996,050 A | * | 11/1999 | Carter et al. ................ | 711/141 |
| 6,145,059 A | * | 11/2000 | Arimilli et al. ............. | 711/143 |
| 6,170,070 B1 | * | 1/2001 | Ju et al. ..................... | 714/718 |
| 6,247,098 B1 | * | 6/2001 | Arimilli et al. ............. | 711/141 |
| 6,330,643 B1 | * | 12/2001 | Arimilii et al. ............. | 711/141 |
| 6,334,172 B1 | * | 12/2001 | Arimilli et al. ............. | 711/144 |

* cited by examiner

*Primary Examiner*—Vuthe Siek
*Assistant Examiner*—R. M. Thompson
(74) *Attorney, Agent, or Firm*—Robert D. Marshall, Jr.; W. James Brady, III; Frederick J. Telecky, Jr.

(57) ABSTRACT

A method generates a list of allowed states in a cache design by applying each input transaction sequentially to all found legal cache states. If application of an input transaction to a current search cache results in a new cache state, then this new cache state is added to the list of legal cache states and to a list of search cache states. This is repeated for all input transactions and all such found legal cache states. At the same time a sequence of input transactions reaching each new cache state is formed. This new sequence is the sequence of input transactions for the prior cache state and the current input transaction. The method generates a series of test sequences from the list of allowed states and their corresponding sequence of input transactions which are applied to the control logic cache design and to a reference memory. If the response of the control logic cache design fails to match the response of the reference memory, then a design fault is detected.

3 Claims, 3 Drawing Sheets

(1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

AUTOMATED METHOD FOR TESTING CACHE

This application claims priority under 35 U.S.C. 119(e)(1) from U.S. Provisional Patent Application No. 60/144,568 filed Jul. 15, 1999.

TECHNICAL FIELD OF THE INVENTION

The present invention is related to methods for testing cache memory systems.

BACKGROUND OF THE INVENTION

A typical data processing system includes at least a central processing unit (CPU), a memory unit (main memory), and an input/output (I/O) unit. The main memory stores n addressable storage locations information that is either data or instructions for operating on the data. The information is transferred between the main memory and the CPU by a bus.

If the CPU operates within a fast clock and the response time of the main memory is slow compared to the CPU clock, the CPU must enter a wait state until the request is completed and the CPU processing rate is reduced. This is especially problematic for highly pipelined CPUs, such as reduced instruction set computers (RISCs).

Main memory is typically not fast enough to execute memory accesses as needed by a high speed CPU. To get a high speed execution rate of instructions, a small block of fast memory (called a cache) may be placed between the CPU and the main memory. Such cache memories are used to compensate for the time differential between the memory access time and the CPU clock frequencies. The access time of a cache is closer to the operational speed of the CPU and thus increases the speed of data processing by providing information to the CPU at a rapid rate. In addition, multiple levels or layers of cache may be placed between the CPU and main memory.

A cache memory is typically organized into blocks, each of which is capable of storing a predetermined amount of information. Specifically, each block may contain the data and/or instructions needed by the CPU, as well as control flags indicating the status of the data and/or instructions. When a CPU requires information, the cache is initially examined. If the information is not found in the cache known as a cache miss, then either the next higher level cache or the main memory is accessed. For a cache miss, a read request is then issued by the cache controller to transfer a block of information including the required information from the higher level cache or main memory to the CPU and cache. The information is retrieved from the higher level cache or main memory and loaded into a cache block and the cache block is assigned a cache address. The cache address typically includes an index field and a tag field, which correspond to address fields of the location in main memory from which the information was retrieved.

Because data may be used by any program, copies of the same information may reside in more than one place in the memory system. For example, copies of the same information may reside in multiple caches and in the main memory unit. If the CPU modifies a copy of that information in one cache without updating the remaining copies, those remaining copies of information become stale, thus creating a cache-coherency problem.

The prior art includes many solutions for the cache-coherency problem. These solutions are typically based upon the states of the control flags associated with the information contained in a cache. For example, the control flags may include a hit flag that indicates whether a cache hit occurred during a particular cache access, a valid flag that indicates whether the information contained in a cache block is valid, a modified or dirty flag that indicates whether the valid cache block has been modified from the information stored in the corresponding location in main memory while in the cache, and a shared flag that indicates whether the valid information contained in the block is also stored in another cache.

Designers of these types of data processing systems increasingly employ high-level software languages to specify their designs. For example, a given hardware model may have a high-level representation in VHDL, which is a hardware description language, or RTL. The designer may then employ software tools to develop an appropriate circuit design from the given high-level description. An important operation in this process is the verification or validation of the high-level description. If the high-level description contains inaccuracies or produces incongruous results, then the circuit designed from that description will contain errors or faults. To validate the description, the designer must ensure that the set of all possible input configurations produces the proper responses. One method of performing the validation step is to apply every possible input configuration to the high-level description and observe the results. However, for designs of large complexity, such as a multilevel cache memory system which will have large sets of distinct input configurations, such a method is impractical.

Cache control logic is typically used to examine the states of these control flags and perform appropriate operations in accordance with a particular cache-coherency protocol. During the design verification stage of product development, this control logic must be tested to ensure that it is operating properly. The CPU is typically programmed to test the control logic by directly examining the control flags and data in the cache under certain conditions and comparing their states with the results obtained by the control logic under the same conditions.

SUMMARY OF THE INVENTION

Therefore, it is among the objects of the invention to provide a method to verify the operation of cache control logic by examining the states of its cache.

Another of object of the invention is to provide a method to efficiently detect all legal cache states in a multilevel cache memory system. The method starts with a list of all possible input transactions having an effect on the state of the cache, an initial cache state and an initial sequence of input transactions to reach the initial cache state.

The method generates a list of allowed states by associating the list of all possible input transactions with each legal cache state, starting with the initial cache state. In the preferred embodiment the list is generated by applying each input transaction sequentially to all found legal cache states. This is begun by initializing the legal cache states and the search cache states as the initial cache state. If application of an input transaction to a current search cache results in a new cache state, then this new cache state is added to the list of legal cache states and to the list of search cache states. This is repeated for all input transactions and all such found legal cache states. At the same time a sequence of input transactions reaching each new cache state is formed. This new sequence is the sequence of input transactions for the prior cache state and the current input transaction.

The method then generates a series of test sequences from the list of allowed states and their corresponding sequence of input transactions. These may be made in a directed random manner. The series of test sequences are applied to the control logic cache design and to a reference memory. The results are compared. If the response of the control logic cache design fails to match the response of the reference memory then a design fault is detected.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
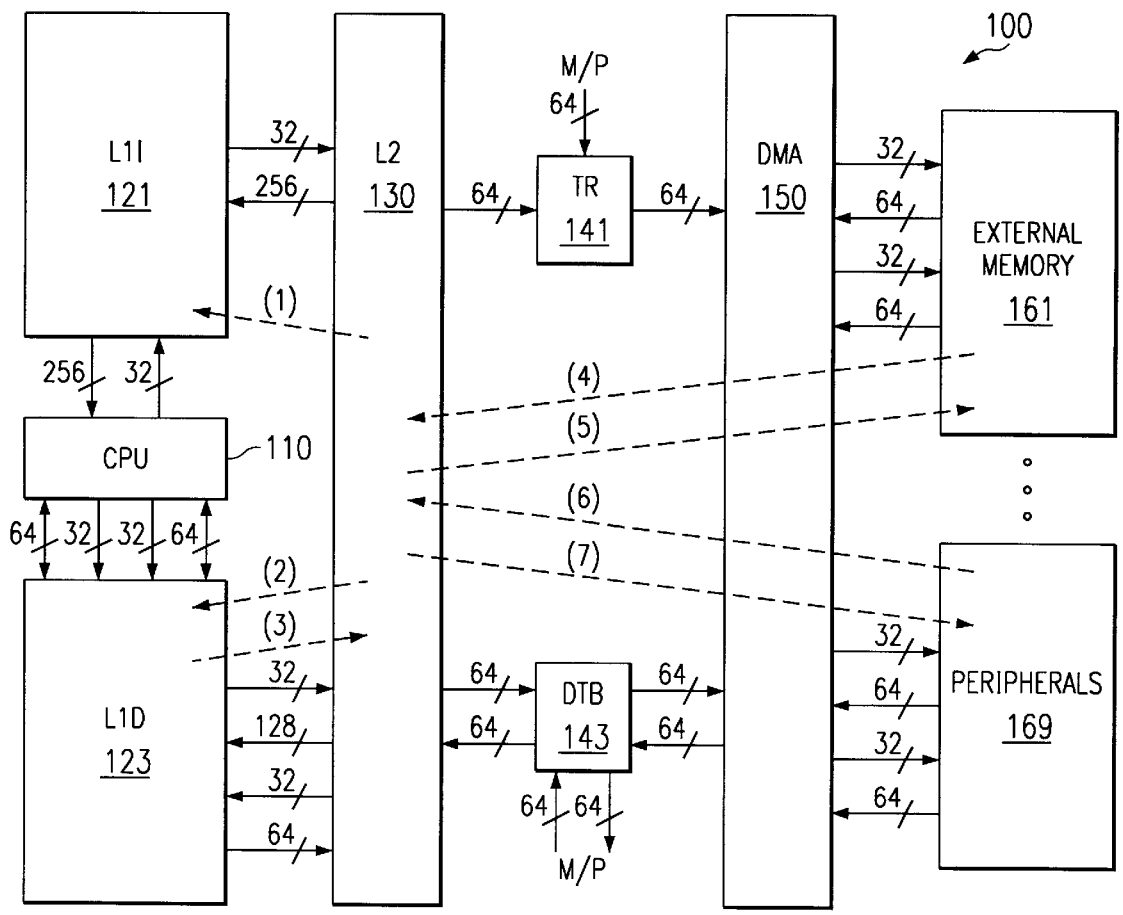
FIG. 1 illustrates the organization of a typical digital signal processor to which this invention is applicable.

FIG. 1 illustrates the organization of a typical digital signal processor system 100 to which this invention is applicable. Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 also know as a transfer controller provides the connection of digital signal processor system 100 to external memory 161 and external peripherals 169.

In accordance with the preferred embodiment of this invention, level two unified cache 130 may be configured to include variable amounts of static random access read/write memory (SRAM) instead of cache memory. This aspect of the digital signal processor system is further detailed in U.S. Provisional Patent Application No. 60/166,534 entitled UNIFIED MEMORY SYSTEM ARCHITECTURE INCLUDING CACHE AND ADDRESSABLE STATIC RANDOM ACCESS MEMORY filed Nov. 18, 1999, now U.S. patent application Ser. No. 09/603,645 filed Jun. 26, 2000. In accordance with the invention described in that patent application some or all of level two unified cache 130 may be configured as normal read/write memory which operates under program control. If some of level two unified cache 130 is configured as read/write memory, then this memory space may be either a source or a destination of a direct memory access. This will be more fully described below.

The complex interrelation of parts of digital signal processor system 100 permits numerous data movements. These are illustrated schematically in FIG. 1 and will be listed here. First, level one instruction cache 121 may receive instructions recalled from level two unified cache 130 (1) for a cache miss fill. In this example, there is no hardware support for self-modifying code so that instructions stored in level one instruction cache 121 are not altered. There are two possible data movements between level one data cache 123 and level two unified cache 130. The first of these data movements is a cache miss fill from level two unified cache 130 to level one data cache 123 (2). Data may also pass from level one data cache 123 to level two unified cache 130 (3). This data movement takes place upon; a write miss to level one data cache 123 which must be serviced by level two unified cache 130; a victim eviction from level one data cache 123 to level two unified cache 130; and a snoop response from level one data cache 123 to level two unified cache 130. Data can be moved between level two unified cache 130 and external memory 160. This can take place upon: a cache miss to level two unified cache 130 service from external memory (4) or a direct memory access 150 data movement from external memory 161 and to a portion of level two unified cache 130 configured as read/write memory; a victim eviction from level two unified cache 130 to external memory 161 (5) or a direct memory access 150 data movement from a portion of level two unified cache 130 configured as read/write memory to external memory 161. Finally, data can move between level two unified cache 130 and peripherals 169. These movements take place upon: a direct memory access 150 data movement from peripheral 169 to a portion of level two unified cache 130 configured as read/write memory; or a direct memory access 150 data movement from a portion of level two unified cache 130 configured as read/write memory to peripherals 169. All data movement between level two unified cache 130 and external memory 161 and between level two unified cache 130 and peripherals 169 employ data transfer bus 143 and are controlled by direct memory access unit 150. These direct memory access data movements may take place as result of a command from central processing unit core 110 or a command from another digital signal processor system received via transfer request bus 141.

The number and variety of possible data movements within digital signal processor system 100 makes the problem of maintaining coherence difficult. In any cache system data coherence is a problem. The cache system must control data accesses so that each returns the most recent data. As an example, in a single level cache a read following a write to the same memory address maintained within the cache must return the newly written data. This coherence must be maintained regardless of the processes within the cache. This coherence preserves the transparency of the cache system. That is, the programmer need not be concerned about the data movements within the cache and can program without regard to the presence or absence of the cache system. This transparency feature is important if the data processor is to properly execute programs written for members of a data processor family having no cache or varying amounts of cache. The cache hardware must maintain the programmer illusion of a single memory space. An example of an ordering hazard is a read from a cache line just victimized and being evicted from the cache. Another example in a non-write allocate cache is a read from a cache line following a write miss to that address with the newly written data in a write buffer waiting write to main memory. The cache system must include hardware to detect and handle such special cases.

A cache system including a second level cache, such as that described above in conjunction with FIG. 1, introduces additional hazards. Coherence must be maintained between the levels of cache no matter where the most recently written data is located. Generally level one caches accessing data will have the most recent data while the level two cache may have old data. If an access is made to the level two cache the cache system must determine if a more recent copy of the data is stored in a level one cache. This generally triggers a snoop cycle in which the level two cache polls the level one cache for more recent data before responding to the access. A snoop is nearly like a normal access to the snooped cache except that snoops are generally given higher priority. Snoops are granted higher priority because another level cache is stalled waiting on the response to the snoop. If the data stored in the lower level cache has been modified since the last write to the higher level cache, then this data is supplied to the higher level cache. This is referred to as a snoop hit. If the data stored in the lower level cache is clean and thus not been changed since the last write to the higher level cache, then this is noted in the snoop response but no data moves. In this case the higher level cache stores a valid copy of the data and can supply this data.

Additional hazards with a two level cache include snoops to a lower level cache where the corresponding data is a victim being evicted, snoops to data during a write miss in the lower level cache for non-write allocation systems which places the data in a write buffer. Level two unified cache 130 may need to evict a cache entry which is also cached within level one instruction cache 121 or level one data cache 123. A snoop cycle is required to ensure the latest data is written out to the external main memory. A write snoop cycle is transmitted to both level one instruction cache 121 and level one data cache 123. This write snoop cycle misses if this data is not cached within the level one caches. Level one data cache 123 reports the snoop miss to level two unified cache 130. No cache states within level one data cache 123 are changed. Upon receipt of the snoop miss report, level two unified cache 130 knows that it holds the only copy of the data and operates accordingly. If the snoop cycle hits a cache entry within level one data cache 123, the response differs depending on the cache state of the corresponding cache entry. If the cache entry is not in a modified state, then level two unified cache 130 has a current copy of the data and can operate accordingly. The cache entry is invalidated within level one data cache 123. It is impractical to maintain cache coherency if level one data cache 123 caches the data and level two unified cache 130 does not. Thus the copy of the data evicted from level two unified cache 130 is no longer cached within level one data cache 123. If the cache entry in level one data cache 123 is in the modified state 303 and thus had been modified within that cache, then the snoop response includes a copy of the data. Level two unified cache 130 must merge the data modified in level one data cache 123 with data cached within it before eviction to external memory. The cache entry within level one data cache 123 is invalidated.

In a similar fashion snoop cycles are sent to level one instruction cache 121. Since the digital signal processing system 100 cannot modify instructions within level one instruction cache 121, no snoop return is needed. Upon a snoop miss nothing changes within level one instruction cache 121. If there is a snoop hit within level one instruction cache 121, then the corresponding cache entry is invalidated. A later attempt to fetch the instructions at that address will generate a cache miss within level one instruction cache 121. This cache miss will be serviced from level two unified cache 130.

Those skilled in the art would realize that design of such a complex cache system is a demanding task. Cache design testing must be an integral part of such a design to insure that the various parts operate as planned. A cache system testbench is an integral part of the cache testing methodology. The memory system entirely can be from the rest of the circuit using a cache system testbench. This is desirable for several reasons.

First, it allows us greater control and predictability of the stimulus which is applied to the cache system. For example, without the cache system testbench all the instruction fetch commands would have to be generated by the CPU. Similarly, the data fetches would be generated from CPU load and store instructions. For a given set of desired cache system stimulus, a complex CPU program must be written. This is not desirable.

Second, the cache system testbench allows greater observability. The cache system testbench can verify that every byte of data that is returned is correct. If the CPU were used as the verification environment rather than a cache system testbench, there would be problems with verifying code fetches. First, the CPU must actually execute the incorrectly fetched code. Note that the CPU will not necessarily execute all code that it fetches. Secondly, the CPU must effectively blow up when incorrect code is executed.

The best solution to both of these problems is to use a cache system testbench. The cache system testbench is a VHDL which is built around the cache sub-system design which simulates central processing unit 110 and the direct memory access unit/transfer controller 150. This removes the cache sub-system from its normal environment and places it in a very controlled environment enabling close observation of how the cache behaves. The cache system testbench emulates every interface of the cache system. Every control signal is monitored and every data bus checked. The cache system testbench simulates the CPU making memory requests and also simulates the direct memory access unit/transfer controller. Thus the cache testbench will respond appropriately to requests made by the cache system.

The cache system testbench is also self-checking. When the cache system testbench performs a read request, it knows what data the cache system should return. If incorrect data is returned, the cache system testbench will stop and flag the error for human debugging.

Figure 2:
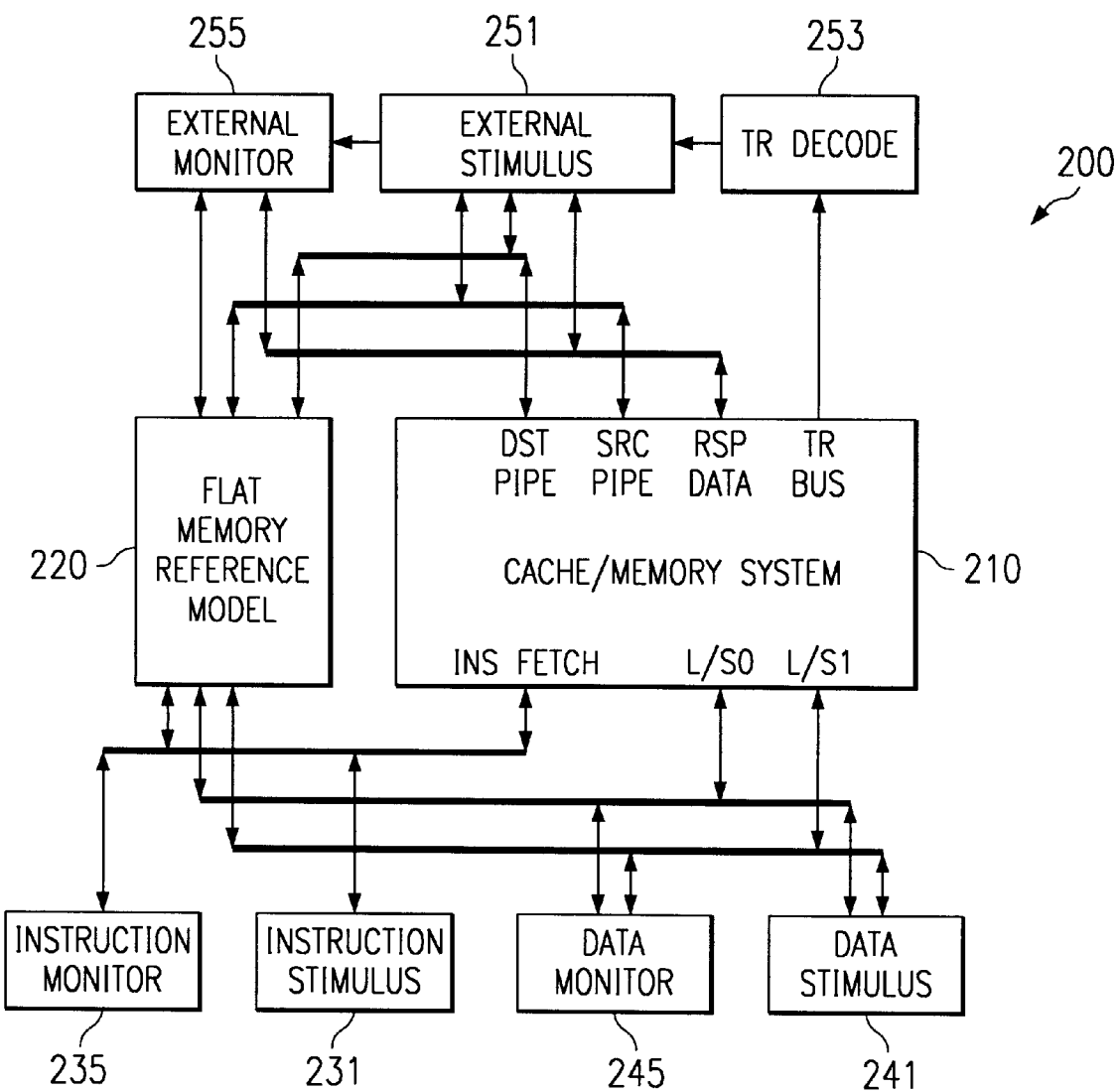
FIG. 2 illustrates the organization of a cache memory system test bench used in this invention.

FIG. 2 illustrates the parts of the preferred embodiment of the cache system testbench 200 used to test cache/memory system design 210 in this invention. The cache testbench consists of three main components: the stimulus interface; the reference model; and the monitors. The stimulus interface of cache system testbench consists of the following parts: instruction stream simulator 231; data stream stimulator 241; external stream stimulator 251; and transfer request decode logic 253. The monitors include: instruction stream monitor 235; data stream monitor 245; and external stream monitor 255. The reference model includes flat memory reference model 220.

Generally the test will apply the same stimulus to cache/memory system 210 as to flat memory reference model 220 to see if they produce the same results. Flat memory reference model 220 is assumed to be correct since it is so simple. Therefore differing results indicates a design error in cache/memory system .

Cache/memory system 210 is the high level design code of the cache/memory design under test. Cache/memory system 210 has a number of connections to external systems corresponding to the connections of the cache system under design test. As shown in FIG. 1, this is potentially a very complex memory system with three levels: level one instruction cache 121 and level one data cache 123; level two unified cache 130; and the main memory. There are thus many opportunities for design errors. Data is constantly being moved about and cache evictions will often go to the wrong place before the design has been fully debugged. Cache/memory system 210 requests instructions from memory via an instruction fetch port (InsFetch). Cache/memory system 210 may transfer data by loading data from memory or storing data to memory via two load/store ports (L/S0 and L/S1). Cache/memory system 210 also interacts with external input/output systems via a destination pipe (Dst Pipe), a source pipe (Src Pipe) and a response pipe (Rsp Data). Lastly, cache/memory system 210 may make data transfer request via a transfer request bus (TR Bus). These connections in the design model correspond to connections in the proposed design of the real digital signal processor 100 illustrated in FIG. 1.

Flat memory reference model 220 presents a high-level view of a memory system that is actually quite simple. If you write some data to an address, when you next read from that address, you should see the data that you just wrote. The beauty of this reference model is its simplicity. Writes go in and reads come out.

Flat memory reference model 220 contains a 4 port sparse memory which holds an image of the entire digital signal processor memory as it should be seen by the cache. Flat memory reference model 220 is initialized to be the same as the external memory, but the two systems may diverge as accesses to static random access memory space are put into flat memory reference model 220 but not the external image. Writes to and reads from flat memory reference model 220 should echo those into and out of cache/memory system 210.

The stimulus interface controls what data requests are made to the memory system. The stimulus is decided before the simulation begins. This stimulus is generated by a cache unit test generation program. This cache unit test generation program produces a set of transactions and an order in which transactions should take place. The sets of available transactions include: instruction read; load/store unit 0 read; load/store unit 0 write; load/store unit 1 read; load/store unit 1 write; transfer controller 130 read from a read/write memory configured portion of unified level two cache 130; and transfer controller 150 write to a read/write memory configured portion of unified level two cache 130. The cache unit test generation program outputs three separate stream files. One is instruction stream stimulator 231, one for data stream stimulator 241, which covers both load/store units and one for external stream stimulator 251 which covers response to transfer requests and input/output activity.

Now each of the three stream stimulators 231, 241 and 251 reads the transactions from an internal transaction file one transaction at a time. These stream stimulators follow the appropriate memory system protocols to apply them to the cache/memory system 210. These transaction files don't contain the expected data, nor do the transaction files specify the exact cycle in which the stimulus is applied. It is up to stream stimulator to apply the transactions as quickly as possible. As a final note for completeness, each stream stimulator 231, 241 and 251 will also respond to a synchronize command. This synchronize command causes each stream stimulator to wait until they all get to a synchronization point.

Instruction stream stimulator 231 contains a single-port sparse memory which is loaded with the instruction thread of the test. Instruction stream stimulator 231 reads each command and applies it to the level one instruction cache interface of the memory system. Commands are also applied to the reference memory.

Data stream stimulator 241 contains a dual-port sparse memory which is loaded with the data thread of the test. Data stream stimulator 241 reads two commands out every cycle and applies one or both commands to the two load-store interfaces of the level one data cache. Data stream stimulator 241 also applies these commands to flat memory reference model 220.

External stream stimulator 251 contains two single-port sparse memories. One memory is loaded with the external thread of the test. External stream stimulator 251 applies commands to the source and destination pipe interfaces of cache/memory system 210 and reads response data from cache/memory system 210. The commands come from both the command memory in external stream stimulator 251 and from the command queue kept by transfer request decode logic 253. If only one or the other of the command queues has a command ready, then it is applied. If both command queues are ready, some arbitration scheme will decide which goes first. The other sparse memory is loaded with an image of external memory. Read commands from transfer request decode logic 253 get their read data from this image and write commands from transfer request decode logic 253 write back the response data to this image. Commands from the external thread of the test should only access internal memory. Destination commands have data embedded in the command and source commands should read only from internal locations.

Transfer request decode logic 253 reads transfer request packets from level two unified cache 130 via a transfer request bus 141 from cache/memory system 210 and decodes them into commands for the external stream stimulator 251 to execute. After decoding, the commands are placed into an internal dual-port sparse memory. Commands are read out one at a time and sent to the external stream stimulator 251, which must send back an acknowledge signal. External stream stimulator 251 prioritizes between these commands and the external thread of the test and applies the commands to cache/memory system 210.

The monitors 235, 245 and 255 merely watch for data being returned from cache/memory system 210 and compare that to the data being returned from flat memory reference model 220. If they differ, an error is flagged so that the cache system designers can debug it. The monitors are actually slightly more complex than that, because due to the latencies of the cache system, sometimes there is more than one correct answer. It is assumed that the cache is operating correctly if it matches any of the possibly correct answers.

Instruction stream monitor 235 snoops instruction fetch activity generated by instruction stream stimulator 231. Instruction stream monitor 235 reads data returned by cache/ memory system 210 and by flat memory reference model 220 and compares for mismatches or other errors. Instruction stream monitor 235 triggers assertions which kill the simulation if any errors are found.

Data stream monitor 245 snoops data stream activity generated by data stream stimulator 241. When one or both of the data streams are doing a read, data stream monitor 245 compares the returned read data against that returned by flat memory reference model 220. Mismatches or other errors detected by data stream monitor 245 trigger assertions that kill the simulation.

External stream monitor 255 sets source pipe commands from external stream stimulator 251 and checks response data against flat memory reference model 220. External stream stimulator 251 sends a different command to external stream monitor 255 than to cache/memory system 210. If the command is to internal static random access memory space, the same address is used for both accesses. If the command is to external memory space, such as generated by a data transfer request triggered by level two unified cache 131, then external stream stimulator 251 sends the destination or cache address to cache/memory system 210 and sends the source or physical address to external stream monitor 255 for checking against flat memory reference model 220. External stream monitor 255 compares data returned by cache/memory system 210 and by flat memory reference model 220 and triggers assertions on mismatches or other errors.

Cache system testbench 200 is the final piece of the cache verification puzzle. The cache legal state generation program, to be described below, explores state machines to find interesting stimulus. This program does not know whether a particular protocol will behave in a coherent manner, that is, whether cache/memory system 210 behaves as a flat memory reference model 220. It is up to cache system testbench 200 to verify that cache/memory system 210 and its protocol behave as flat memory reference model 220. Cache system testbench 200 merely provides stimulus to cache/memory system 200. Cache system testbench 200 does not know what is an interesting stimulus. Cache system testbench 200 must be told which stimuli are interesting by the stimulus files generated by the cache legal state generation program.

The following terms will be used in the description of the cache legal state generation program:

Cache State—The state of the entire cache system for one full line of the largest line sized sub-cache. For instance, if level two unified cache 130 has 64 byte lines, level one instruction cache 121 has 32 byte lines and level one data cache 123 has 16 byte lines, Line State refers to the state of an entire line of level two unified cache 130. This includes the state of the line in level two unified cache 130 as well as the state of the 2 sub-lines in level one instruction cache 121 that correspond to the that line in level two unified cache 130 and the state on 4 corresponding sub-lines in level one data cache 123.

Input transaction—An external event or set of events that can effect the internal state of the cache. Examples include instruction fetches by central processing unit core 110, loads and stores by central processing unit core 110, external snoops and direct memory access transfers to the address being modified. An input transaction could also be one or more accesses to another address that cause side effects on the address being modified. An example of this would be a set of reads that force cache line replacement. Note that identical input transactions to different sub-lines of the full cache line still count as separate input transactions because they may have different effects on the total Line State. A read response from external memory would not be considered an input transaction because it happens only in response to a request from the cache system, not spontaneously.

Initial state—A cache state from which all evaluation of transactions will begin. This state must be reachable from any previous state with one sequence of transactions. This will usually be an all-invalid state.

Figure 3:
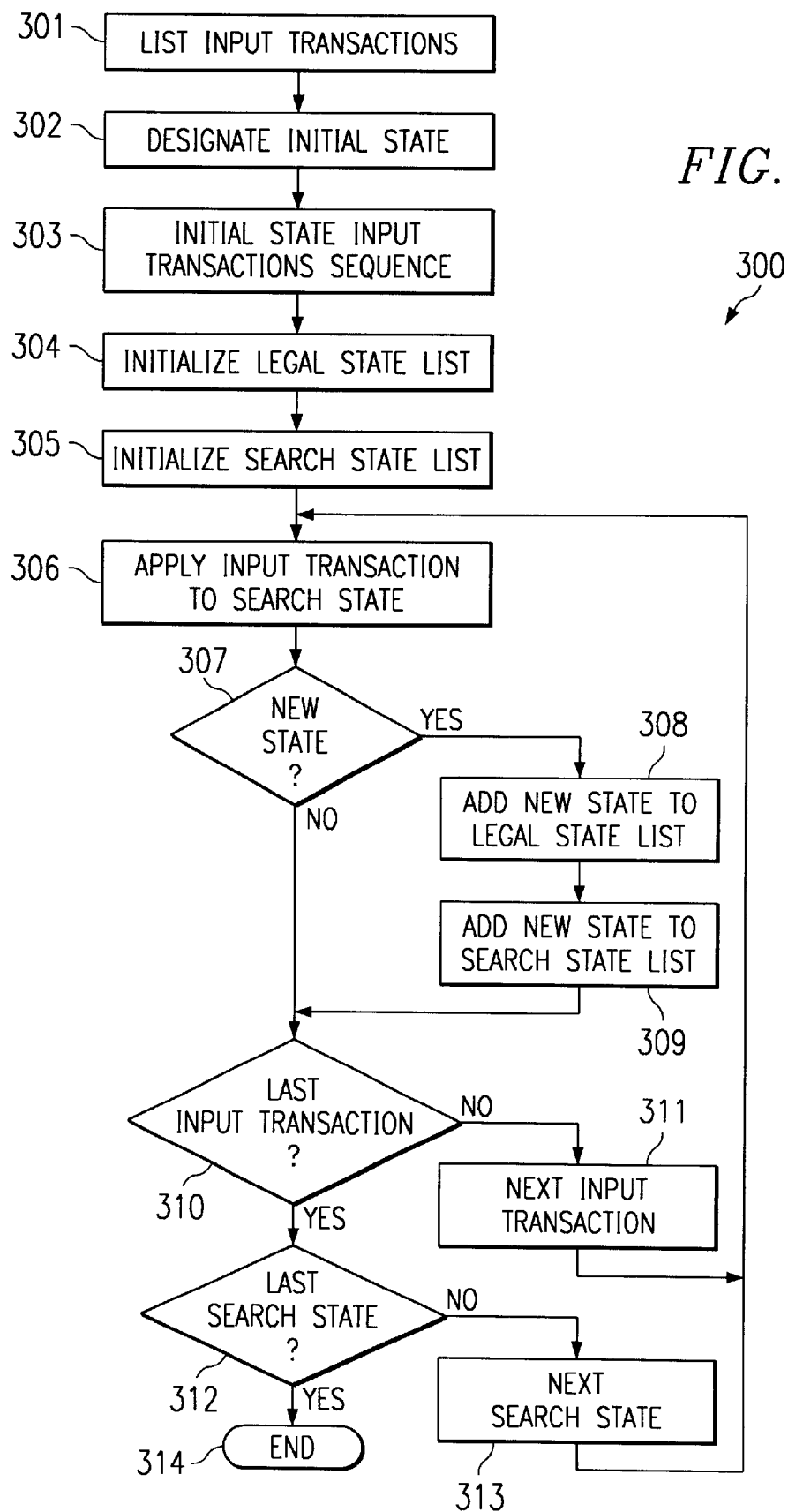
FIG. 3 is a flowchart a cache legal state generation program of this invention

FIG. 3 illustrates the steps of an exemplary cache legal state generation program 300. Cache legal state generation program 300 starts by listing all possible input transactions (processing block 301). Any transaction that could possibly have its own effect on the cache state must be included in this list of input transactions. As noted above these input transactions include: instruction read; reads and writes triggered by either of the load/store units; a transfer controller 150 write to or read from a read/write memory configured portion of unified level two cache 130. Program 300 next designates an initial state (processing block 302) and an initial sequence of input transactions that will generate this initial state (processing block 303). This initial state will generally be selected as an all invalid state, where each cache entry is designated as invalid. The existence of such an initial state and an input transaction sequence to achieve this initial state is assumed for the cache design.

Program 300 then defines the cache protocol and enumerates all possible state transitions. Firstly, a list of currently found legal states (legal states list) is initialized to include the initial state (processing block 304). This legal state list includes a corresponding sequence of input transactions to reach each cache state. For the initial state, the first entry in the legal state list, this sequence of input transactions is the initial sequence of input transactions. Secondly, a search state list of legal cache states to be searched is initialized to include the initial state (processing block 305).

In a first embodiment of this invention, the state transitions for the entire cache system are listed in one table. Each row of this table has a previous state, an input transaction and a resulting next state, taking into account all side effects of the transaction. In a second embodiment of this invention, each sub-cache protocol is described in a separate table (see example below). Each of these tables has an initial state, an input transaction and a next state, as before. Each row could also have resulting transactions that would be applied to other sub-caches as side effects of this transaction. There were rows not only for the external input transactions as listed in processing block 301, but also for transactions that might result as a side effect from one of the other sub-caches. When evaluating these tables, any transactions resulting from the evaluation of one sub cache are immediately applied to another. The final state is the state of all caches after all side effect transactions have been applied.

Following this preparation, program 300 searches for all legal cache states. Program 300 applies a next input transaction from the list of input transactions to a currently considered cache state in the search state list which may result in a new cache state (processing block 306). The search list begins with only the initial state, which by definition is legal and reachable by some known set of transactions. Program 300 then determines if the resulting state is a new state (decision block 307). The resulting state is a new state if it is not already in the legal state list. If the application of the input transaction to the current cache state (processing block 306) results in a new cache state (Yes at decision block 307), then this new state is added to the legal state list (processing block 308). Associated with this new state in the legal state list is a sequence of input transactions to achieve this state. This sequence of input transactions is the sequence of input transactions to reach the prior state and the input transactions of processing block 306 which resulted in this new state. Program 300 then adds this new state to the search state list (processing block 309). This search state list includes all previously found legal cache states which have not been searched for transitions to new states.

If the next state produced by processing block 306 is already on the legal state list (No at decision block 307), then current transaction is discarded and program 300 determines if the current input transaction was the last input transition (decision block 310). If the current input transition of processing block 306 was not the last input transaction for the current cache state (No at decision block 310), the cache legal state generation program 300 moves on to consider the next possible input transaction (processing block 311). Program 300 returns to processing block 306 to apply this next input transaction to the current legal cache state (processing block 306). When all input transactions have been applied to a certain cache state (Yes at decision block 310), the program 300 checks to determine in the current cache state is the last cache state in the search state list (decision block 312). If the current cache state is not the last cache state in the search state list (No at decision block 312), then program 300 moves to the next cache state in the search state list (processing block 313). The last cache state may be removed from the search state list or it may be marked as complete so that this last state is no longer evaluated. The next input transaction is also reset to the first input transaction. Thereafter the first input transaction is applied to the next cache state in the search state list (processing block 306). Eventually, all input transactions applied to a particular cache state will generate states that are already in the legal state list. As this happens, the search state list gets shorter until it is empty (Yes at decision block 312). When the search state list is complete and all input transactions have been applied to all previously found cache states, all legal cache states have been found (end block 314). The legal state list with the corresponding sequence of input transactions is complete. Cache legal state generation program 300 produces this list for examination and further processing.

This is an example of some of the data generated for level one instruction cache 121 for the second embodiment using separate tables for separate sub-caches. Table 1 lists the states used in this example.

The input CMD and WHERE fields define possible transactions. The instruction side read and the MYVCT (line replacement) are input transactions. The INVAL comes from the cache above as a side effect of other transactions or from central processing unit core 110 as an input. DC means don't care. The output CMD and WHERE fields define transactions that occur in other caches as a result of the current transaction. The special case ERROR defines a state transition that should never occur.

The first line in the table above describes the simple case where central processing unit core 110 reads a line that is not present. A read is sent to the cache above and the line ends up being present. The third line describes a read to a line that is already present. This keeps the line in the same state and causes no other transactions. The last half describes invalidation and victim commands. Both cause a line that is present to be invalidated, but an invalidation command can come in for a line that is not present. A victim command should never come in for a line that is not present.

Table 2 is the beginning of the list of found states for digital signal processor system 100 with level two unified cache 130 in cache mode. The state is listed at the beginning, with each digit representing a different piece of the total cache state. Two sub-lines of the level one instruction cache 121 state are list first, separated by a single underscore. Four sub-lines of the level one data cache 123 state are listed next. Finally the state of the level two unified cache 130 is listed. This includes MESI (Modified, Exclusive, Shared, Invalid) state followed by dirty bits for each subline of level one data cache 123. Note since self-modifying code is not supported, instructions cannot be altered within level one instruction cache 121 and therefore never have a dirty state. The Command Sequence column lists the sequence of input transactions to reach that cache state. Note that the first state in the list is just the initial, all invalid state. The second line shows a state that is reachable in three input transactions. The last line listed here requires a sequence of seven input transactions. The longest sequence in this set is twelve input transactions. Such a state would be rarely reached in a purely random testing environment. Thus the generation of this list of all possible cache states facilitates cache testing and design verification.

TABLE 2

| L1I | L1D | L2 | Command Sequence |
|---|---|---|---|
| _00_00 | _00_00_00_00_ | 000000- | INITIAL |
| _00_00 | _00_00_00_00_ | 110000- | INITIAL:READ/INS/0: INVAL/INS/0 |
| _00_00 | _00_00_00_00_ | 110001- | INITIAL:READ/DAT/3: MYVCT/DAT/3 |

TABLE 1

| Inputs | | | | Outputs | | | |
|---|---|---|---|---|---|---|---|
| Cmd | Where | Valid | Mesi | Valid | Mesi | Cmd | Where |
| READ | INS | 0 | DC | 1 | MESI_S | READ | ABV |
| READ | INS | 1 | MESI_I | 0 | MESI_I | ERROR | DC |
| READ | INS | 1 | MESI_S | 1 | MESI_S | NOP | DC |
| INVAL | DC | DC | DC | 0 | MESI_I | NOP | DC |
| MYVCT | DC | 0 | DC | 0 | MESI_I | ERROR | DC |
| MYVCT | DC | 1 | MESI_S | 0 | MESI_I | NOP | DC |

TABLE 2-continued

| L1I | L1D | L2 | Command Sequence |
|---|---|---|---|
| _00_00 | _00_00_00_00_ | 110010- | INITIAL:READ/DAT/2:MYVCT/DAT/2 |
| _00_00 | _00_00_00_00_ | 110011- | INITIAL:READ/DAT/2:MYVCT/DAT/2:READ/DAT/3:MYVCT/DAT/3 |
| _00_00 | _00_00_00_00_ | 110100- | INITIAL:READ/DAT/1:MYVCT/DAT/1 |
| _00_00 | _00_00_00_00_ | 110101- | INITIAL:READ/DAT/1:MYVCT/DAT/1:READ/DAT/3:MYVCT/DAT/3 |
| _00_00 | _00_00_00_00_ | 110110- | INITIAL:READ/DAT/1:MYVCT/DAT/1:READ/DAT/2:MYVCT/DAT/2 |
| _00_00 | _00_00_00_00_ | 110111- | INITIAL:READ/DAT/1:MYVCT/DAT/1:READ/DAT/2:MYVCT/DAT/2:READ/DAT3:MYVCT/DAT/3 |

The cache design verification employs the list of legal states and their corresponding sequence to input transactions to generate test macros for each cache state. A macro containing code for the design is created for each sequence of input transactions for each legal cache state. This macro will put a specified cache line in the specified state. This macro always begins with the initial sequence of input transactions that will reach the initial state from any previous state. The rest of the macro implements the sequence of input transactions associated with the cache state. When the macro is finished running, the line should be in the proper state.

The cache design verification then checks that the cache state is correct. The macros described above also include at the end code to check the cache state. The exact mechanics of this process are beyond the current scope, but this would involve looking into the design at all necessary state bits and verifying that they indeed represent the expected state.

Test generation for the cache can be done at several levels. In the preferred embodiment a low level test language is created for the cache test bench. A low level test language assembler processes source files written with this language into a set of synopsis memory image files suitable for execution on cache system test bench 200. The low level test language source files can be written by hand or generated by any kind of automatic test generator. In particular, a random test pattern generator called mguber is preferably used to generate cache tests.

The test generation flow randomizes events on a single command basis. To keep a group of commands together as a single event to be randomized, the commands are combined into a macro. This allows for macros which put the cache into some initial state that would then be followed by a set of commands to run from that initial state. A tool preferably creates macros of low-level commands that will be easier to use by the tester.

The cache legal state generation program 300 described above finds all the reachable states in the cache system, given an initial state and a set of input transactions with their associated state transitions. For the example digital processing system illustrated in FIG. 1, this cache legal state generation program 300 is preferably run for both a system in which level two unified cache 130 is configured for all cache and no directly addressable read/write memory and configured for all directly addressable read/write memory and no cache.

Test generation preferably begins with biased random generation of transactions combined with initial generation from program 300. Holes identified by coverage measurement will be hit with differently biased tests or with handwritten code fragments. A bias file, called a guber preferably is used to generate pseudo-random tests. It also may be used to generate random configurations, although it is anticipated that this will not be routine. The guber file makes a weighted selection of test macros to apply to the cache design from among plural groups. Each time a group is called, one of the members of the group is chosen randomly, according to its weighting. If the member chosen is a sub-group, then one of its members is chosen. Eventually, a command is specified, which may include command parameters specified by another group.

The results of the cache tests are formed in a cache tree file. This file gives a line-by-line list of transactions within the cache, giving only vital information about each transaction. It is intended for initial debugging before the location or nature of a failure is known.

Cache designs tend to be dominated by finite state machines. Thus finite state machine arc (state transitions) coverage is a good measure of test suite quality. In the preferred embodiment finite state machines are coded as tables in the source code in the high level design code, state and arc hits are easily measured. The arc hit data for each test can then be collected and processed. Useful information includes the percent of arcs hit and a minimum set of tests that give equivalent coverage to the full test suite. Additional measures of test quality include the following. Toggle coverage indicates whether bit in the cache design has been toggled during a test simulation. This provides a very crude test coverage measurement. Combinational block coverage reads in the cache design block and finds a set of important or significant inputs using AND/OR reduction. The test coverage measure is on hits to these important inputs. Using this type test coverage measure tends to be prohibitively memory-intensive. Static/dynamic functional measures check the test suite for completion with respect to the total number of states and transactions in the cache design.

What is claimed is:

1. A method for testing a control logic cache design, comprising the steps of:

determining a list of all possible input transactions having an effect on the state of the cache;

determining an initial cache state;

determining an initial sequence of input transactions to reach the initial cache state;

initializing a list of legal cache states with the initial cache state;

generating a list of allowed states by associating the list of all possible input transactions with each legal cache state, starting with the initial cache state;

generating a sequence of input transactions for each allowed state capable of changing the state of the cache from the initial cache state to the allowed state;

generating a series of test sequences from the list of allowed states and their corresponding sequence of input transactions;

applying the series of test sequences to the control logic cache design and to a reference memory;

comparing response of the control logic cache design and the reference memory to the series of test sequences; and determining a cache control logic design error if the response of the control logic cache design fails to match the response of the reference memory.

2. The method of claim 1, wherein:

said step of generating a list of allowed states includes
- initializing the sequence of input transactions for the initial state as the initial sequence of input transactions;
- initializing a list of search cache states with the initial cache state; and
- applying each input transaction sequentially to a current search cache state until all input transactions of the list of input transactions have been applied to the current search cache state and
  - if application of an input transaction to the current search cache results in a new cache state not in the list of legal cache states, then listing the resulting state in the list of legal cache states and the list of search cache states, and generating a sequence of input transactions for the new cache state from the sequence of input transactions for the current cache state and the current input transaction,
  - until each input transaction has been applied to the current search cache state, thereupon setting a current search cache state as a next cache state in the search cache state list, and until all cache states in the search cache state list have had all input transactions applied thereto.

3. A method for determining all legal states of a control logic cache design, comprising the steps of:
- determining a list of all possible input transactions having an effect on state of the cache;
- determining an initial cache state;
- determining an initial sequence of input transactions to reach the initial cache state;
- generating a list of allowed states by associating the list of all possible input transactions with each legal cache state, starting with the initial cache state, said step of generating a list of allowed states including
  - initializing a list of legal cache states with the initial cache state;
  - initializing the sequence of input transactions for the initial state as the initial sequence of input transactions;
  - initializing a list of search cache states with the initial cache state;
  - applying each input transaction sequentially to a current search cache state until all input transactions of the list of input transactions have been applied to the current search cache state and
    - if application of an input transaction to the current search cache results in a new cache state not in the list of legal cache states, then listing the resulting state in the list of legal cache states and the list of search cache states, and generating a sequence of input transactions for the new cache state from the sequence of input transactions for the current cache state and the current input transaction,
    - until each input transaction has been applied to the current search cache state, thereupon setting a current search cache state as a next cache state in the search cache state list, and until all cache states in the search
  - cache state list have had all input transactions applied thereto; and
- generating a sequence of input transactions for each allowed state capable of changing the state of the cache from the initial cache state to said allowed state.

* * * * *